(12) United States Patent
Ishii

(10) Patent No.: US 7,230,428 B1
(45) Date of Patent: Jun. 12, 2007

(54) MAGNETIC RESONANCE IMAGING APPARATUS AND HIGH-FREQUENCY COIL UNIT USED IN THE SAME

(75) Inventor: Manabu Ishii, Otawara (JP)

(73) Assignees: Kabushiki Kaisha Toshiba, Minato-ku, Tokyo (JP); Toshiba Medical Systems Corporation, Otawara-shi, Tochigi (JP)

( * ) Notice: Subject to any disclaimer, the term of this patent is extended or adjusted under 35 U.S.C. 154(b) by 0 days.

(21) Appl. No.: 11/304,699

(22) Filed: Dec. 16, 2005

(51) Int. Cl.
*G01V 3/00* (2006.01)
(52) U.S. Cl. ...................... 324/318; 600/422
(58) Field of Classification Search ............... 324/318; 600/422
See application file for complete search history.

(56) References Cited

U.S. PATENT DOCUMENTS

| | | | | |
|---|---|---|---|---|
| 5,063,933 A | * | 11/1991 | Takahashi | 600/422 |
| 5,150,710 A | * | 9/1992 | Hall et al. | 600/422 |
| 6,317,619 B1 | * | 11/2001 | Boernert et al. | 600/410 |
| 6,466,018 B1 | * | 10/2002 | Dumoulin et al. | 324/318 |
| 6,492,814 B1 | * | 12/2002 | Watkins et al. | 324/318 |
| 2003/0016109 A1 | * | 1/2003 | Schlz et al. | 335/299 |
| 2004/0066194 A1 | * | 4/2004 | Slade et al. | 324/318 |

FOREIGN PATENT DOCUMENTS

JP 2005-192804 7/2005

* cited by examiner

*Primary Examiner*—Brij Shrivastav
*Assistant Examiner*—Megann E. Vaughn
(74) *Attorney, Agent, or Firm*—Nixon & Vanderhye P.C.

(57) ABSTRACT

A magnetic resonance imaging apparatus imaging a subject on the basis of a magnetic resonance signal radiated from the subject in a static magnetic field, includes a radio frequency coil which receives the magnetic resonance signal and has a direction dependency on a flux direction of the static magnetic field, and a support member which rotatably supports the radio frequency coil.

32 Claims, 4 Drawing Sheets

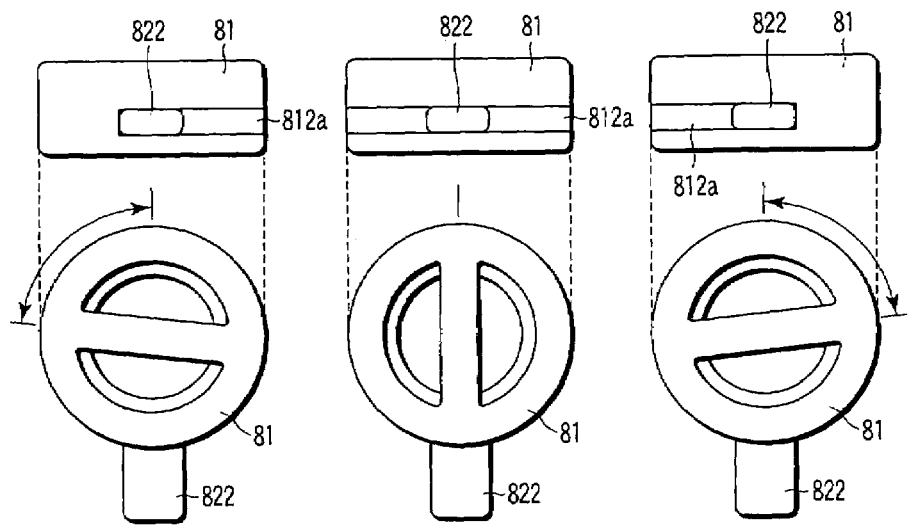
FIG. 4A  FIG. 4B  FIG. 4C
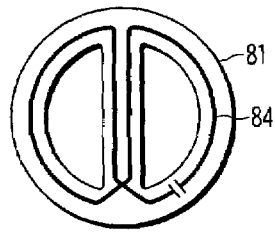 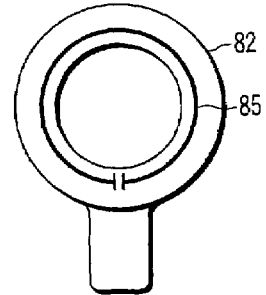
FIG. 5A  FIG. 5B
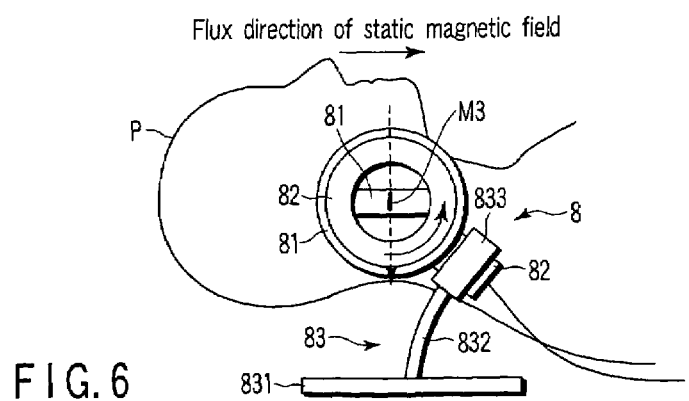
FIG. 6

MAGNETIC RESONANCE IMAGING APPARATUS AND HIGH-FREQUENCY COIL UNIT USED IN THE SAME

BACKGROUND OF THE INVENTION

1. Field of the Invention

This invention relates to a magnetic resonance imaging apparatus, which images the inside of a subject on the basis of a magnetic resonance signal radiated from the subject placed in a static magnetic field, and a radio frequency coil unit used in the magnetic resonance imaging apparatus.

2. Description of the Related Art

In magnetic resonance imaging apparatuses, QD (quadrature) has been used for a signal-receiving radio frequency coil to obtain images of a good SN ratio. For example, a QD coil formed of a circular coil and a saddle coil can obtain an SN ratio of about 1.4 times that of a circular coil alone.

On the other hand, general-purpose surface coils are used to image a region which cannot be imaged by a radio frequency coil dedicated to a specific region. A general-purpose surface coil is attached to the subject by a holding member when used.

The general-purpose surface coil is attached to the subject so as to be close to a region to be imaged as much as possible. Therefore, the general-purpose surface coil changes in attitude with respect to the static magnetic field, according to the region to be imaged.

Because of the above circumstances, a coil having a direction dependency is not used as the general-purpose surface coil. A saddle coil used for a QD coil has a direction dependency with respect to a flux direction of the static magnetic field. Therefore, a QD coil cannot be used as the general-purpose surface coil to further improve the SN ratio.

Jpn. Pat. Appln. KOKAI Pub. No. 2005-192804 discloses an RF coil, whose rotation angle in a plane parallel to the coil surface is adjustable. However, the rotation angle of the RF coil is only adjustable without changing relative positions of a plurality of unit coils.

BRIEF SUMMARY OF THE INVENTION

For the above circumstances, it has been desired to achieve a general-purpose surface coil by using a coil having a direction dependency.

According to an aspect of the present invention, there is provided a radio frequency coil unit used in a magnetic resonance imaging apparatus imaging a subject on the basis of a magnetic resonance signal radiated from the subject in a static magnetic field, comprising: a radio frequency coil which receives the magnetic resonance signal and has a direction dependency on a flux direction of the static magnetic field; and a support member which rotatably supports the radio frequency coil.

According to another aspect of the present invention, there is provided a magnetic resonance imaging apparatus comprising: a static magnetic coil which applies a static magnetic field to a subject; an gradient coil which applies an gradient magnetic field to the subject; a radio frequency coil which receives the magnetic resonance signal and has a direction dependency on a flux direction of the static magnetic field; a support member which rotatably supports the radio frequency coil; and a unit which reconstructs an image on the basis of the magnetic resonance signal received by the radio frequency coil.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 4A, 4B and 4C illustrate a structure of a slit shown in FIG. 3B.

FIGS. 5A and 5B illustrate an accommodating state of coils in the coil cases shown in FIG. 2.

FIG. 6 illustrates an example of a state where the radio frequency coil unit shown in FIG. 1 is used in the first embodiment.

DETAILED DESCRIPTION OF THE INVENTION

Embodiments of the present invention are described below with reference to drawings.

Figure 1:
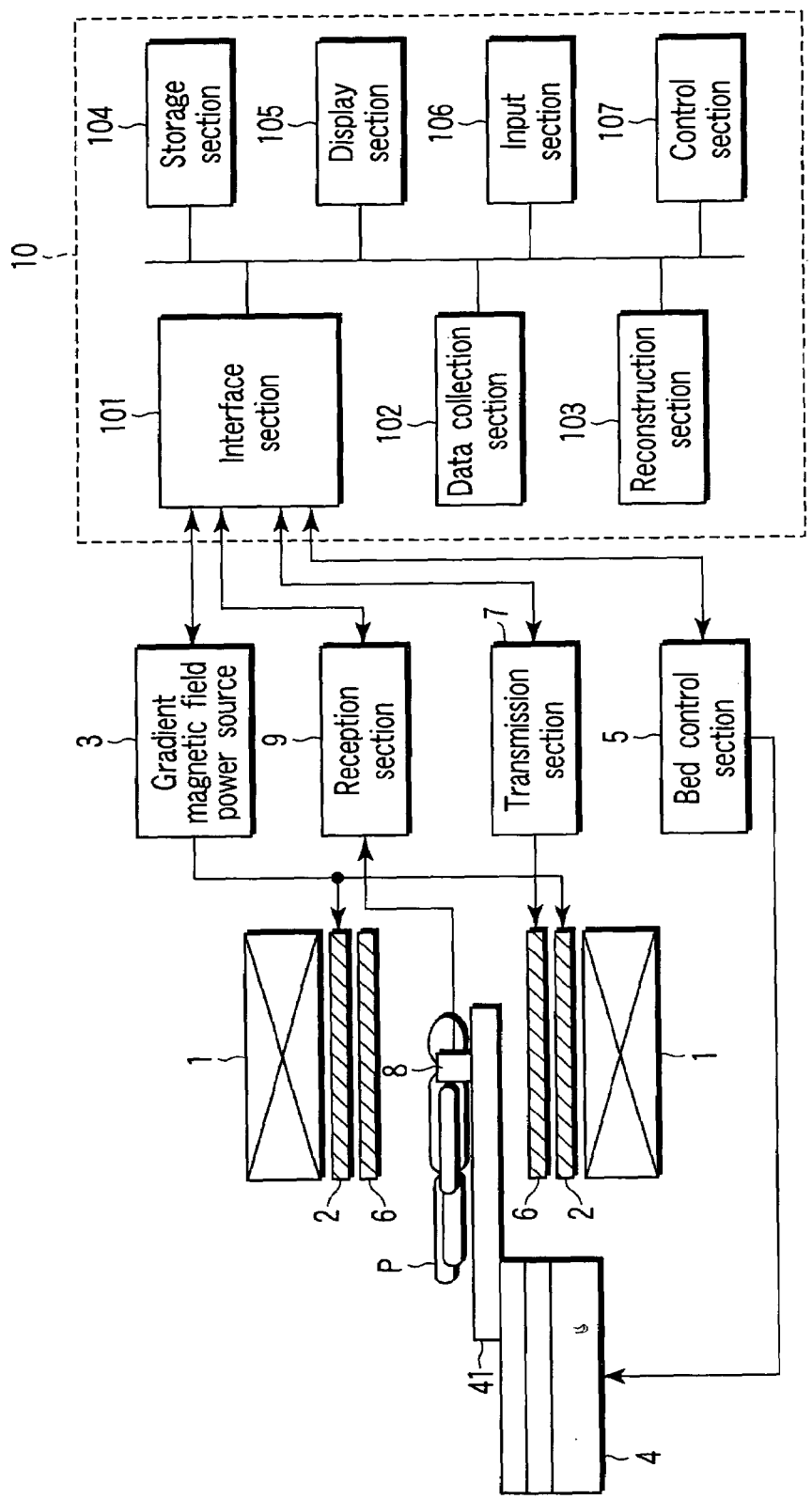
FIG. 1 illustrates a structure of a magnetic resonance imaging apparatus according to an embodiment of the present invention.

FIG. 1 is a diagram illustrating a structure of a magnetic resonance imaging apparatus (MRI Apparatus) according to an embodiment. The MRI apparatus illustrated in FIG. 1 comprises a static field magnet 1, an gradient coil 2, an gradient magnetic field power source 3, a bed 4, a bed control section 5, a transmission RF coil 6, a transmission section 7, a radio frequency coil unit 8, a reception section 9, and a computer system 10.

The static field magnet 1 is hollow and cylindrical, and generates a uniform static magnetic field in its internal space. As the static field magnet 1, for example, a permanent magnet or a superconducting magnet is used.

The gradient coil 2 is hollow and cylindrical, and are located inward of the static field magnet 1. The gradient coil 2 is provided as a set of three coils in connection with X, Y and Z axes perpendicular to each other, respectively. When receiving current supplied from the gradient magnetic field power supply 3, the above three coils, i.e., the gradient coil 2, generate gradient magnetic fields whose magnetic intensities vary in a gradient fashion along the X, Y and Z axes, respectively. Suppose the Z direction is the same as the direction in which, e.g., a static magnetic field acts. The gradient magnetic fields at the X, Y and Z axes correspond to, e.g., gradient magnetic fields Gs, Ge and Gr, respectively. The gradient magnetic field Gs arbitrarily determines a cross section to be imaged. The gradient magnetic field Ge changes the phase of a magnetic resonance signal in accordance with the spatial positions of portions of the gradient magnetic field Ge. The gradient magnetic field Gr changes the frequency of the magnetic resonance signal in accordance with the spatial positions.

A patient P to be examined is introduced into a region of space defined by the gradient coil 2, while lying on the top board 41 of the bed 4. The bed 4 is driven by the bed control section 5 to move the top board 41 in the longitudinal direction thereof and the vertical direction. Generally, the bed 4 is provided such that the longitudinal direction of the top board 41 is parallel to the central axis of each static field magnet 1.

The transmission RF coil 6 is located inward of the gradient coil 2. The transmission RF coil 6 receives a high frequency pulse supplied from the transmission section 7, and generates a high frequency magnetic field.

The transmission section 7 incorporates an oscillation section, a phase selection section, a frequency conversion section, an amplitude modulation section and a high frequency power amplification section. The oscillation section produces a high frequency signal having a resonance frequency specific to atomic nuclei to be targeted in the static magnetic field. The phase selection section selects a frequency of the high frequency signal. The frequency conversion section converts the high frequency signal output from the phase selection section. The amplitude modulation section modulates the amplitude of the high frequency signal output from the frequency conversion section, in accordance with, e.g., a sync function. The high frequency power amplification section amplifies the high frequency signal output from the amplitude modulation section. Then, the transmission section 7 transmits a high frequency pulse corresponding to a Larmor frequency, which is obtained as a result of the operations of the above sections.

The radio frequency coil unit 8 is placed on the top board 41, for example, and located inside the gradient coil 2 when imaging is performed. The radio frequency coil unit 8 receives a magnetic resonance signal radiated from the patient P due to an influence of the high frequency magnetic field. An output signal from the radio frequency coil unit 8 is input to the reception section 9.

The reception section 9 generates magnetic resonance signal data on the basis of the output signal from the radio frequency coil unit 8.

The computer system 10 includes an interface section 101, a data collection section 102, a reconstruction section 103, a storage section 104, a display section 105, an input section 106 and a control section 107.

The interface section 101 is connected with the gradient magnetic field power source 3, the bed control section 5, the transmission section 7, the radio frequency coil unit 8, and the reception section 9. The interface section 101 inputs and outputs signals exchanged between the computer system 10 and the connected sections.

The data collection section 102 collects digital signals output from the reception section 9 through the interface section 101. The data collection section 102 stores the collected digital signals, that is, magnetic resonance signal data, in the storage section 104.

The reconstruction section 103 performs reconstruction processing such as Fourier transform on the magnetic resonance signal data stored in the storage section 104 to obtain spectrum data or image data on a desired nuclear spin in the patient P.

The storage section 104 stores magnetic resonance signal data and spectrum data or image data regarding each of patients.

The display section 105 displays each of various information such as the spectrum data and the image data under control of the control section 107. As the display section 105, a display device such as a liquid crystal display can be used.

The input section 106 receives an instruction from an operator or information input thereby. As the input section 106, an appropriate one of a pointing device such as a mouse or a track ball, a selection device such as a mode switch and an input device such as a keyboard can be used properly.

The control section 107 includes a CPU and a memory, etc., and takes an overall control of the MRI apparatus.

The basic structure of the MRI apparatus according to the embodiment is as described above.

First Embodiment

Figure 2:
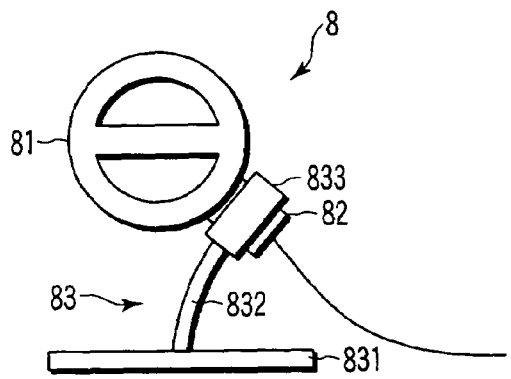
FIG. 2 illustrates a structure of a radio frequency coil unit shown in FIG. 1 in a first embodiment.

In the MRI apparatus according to a first embodiment of the present invention, the radio frequency coil unit 8 has a structure illustrated in FIG. 2.

The radio frequency coil unit 8 has coil cases 81 and 82, and a holding member 83. The coil case 82 rotatably supports the coil case 81. The coil case 82 is held by the holding member 83.

The holding member 83 includes a base 831, an arm 832 and a holding portion 833. The base 831 is placed on, for example, the top board 41, and makes the holding member 83 stand by itself. One end of the arm 832 is attached to the base 831, and the holding portion 833 is attached to the other end of the arm 832. The arm 832 is flexible to change the attitude of the holding portion 833 in three-dimensional directions. The holding portion 833 holds the coil case 82. The coil case 82 is attachable to and detachable from the holding portion 833.

The holding member 83 changes the attitude of the coil case 82 in three-dimensional directions, by bending the arm 832 and changing the attitude of the holding portion 833.

Figure 3A:
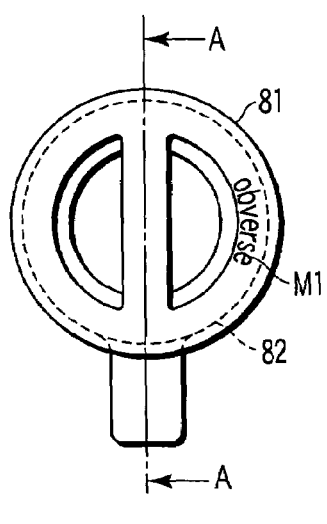
FIGS. 3A, 3B and 3C illustrate structures of coil cases shown in FIG. 2.
Figure 3B:
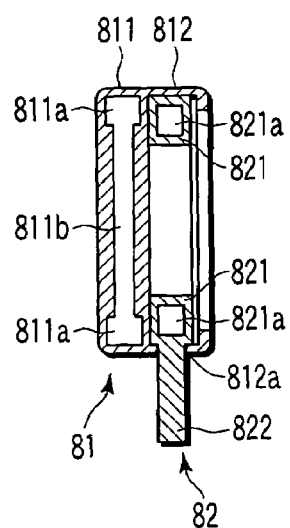
Figure 3C:
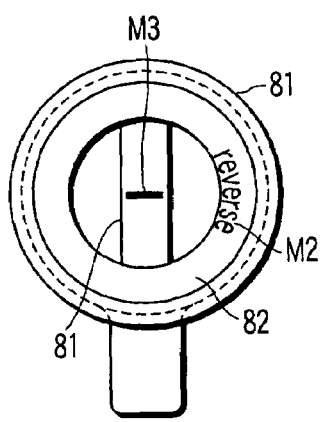

FIGS. 3A, 3B and 3C are diagrams illustrating structures of the coil cases 81 and 82. FIG. 3A is a plan view of a front side of the coil cases, FIG. 3B is a cross-sectional view taken along line A—A in FIG. 3A, and FIG. 3C is a plan view of a back side of the coil cases.

The coil case 81 comprises a main body 811 and a hook portion 812. The main body 811 has a structure including a ring portion and a straight-line portion running through the center of the ring portion. In the ring portion, a hollow portion 811a is formed through the whole circumference of the ring portion. A hollow portion 811b is formed in the straight-line portion. The hollow portion 811b is connected at both ends to the hollow portion 811a. The hook portion 812 projects in a ring shape from the back side of the main body 811. The hook portion 812 has a distal end bent to hold the coil case 82.

The coil case 82 comprises a main body 821 and a support portion 822. In the main body 821, a hollow portion 821a is formed through the whole circumference of the main body 821. The external diameter of the main body 821 is slightly smaller than the internal diameter of the hook portion 812. The support portion 822 projects sideward from the main body 821. The support portion 822 passes through a slit 812a provided at the hook portion 812.

The coil case 81 is rotatable with respect to the coil case 82, as the hook portion 812 slides along an external peripheral surface of the main body 821. Therefore, a rotation axis of the main body 811 nearly coincides with the central axis of the main body 821.

A mark M1 is provided on an obverse side of the coil case 81, indicating that the side is the obverse side. A mark M2 is provided on a reverse side of the coil case 82, indicating that the side is the reverse side. The marks M1 and M2 may be of any form and be provided in any position, as long as the user can distinguish between the obverse side and the reverse side of the high-frequency unit 8. A mark M3 is provided in a position not covered with the coil case 82, on a reverse side of the coil case 81. The mark M3 indicates a magnetic-flux direction of the radio frequency coil unit 8. The mark M3 may be of any form and be provided in any position, as long as the user can recognize the magnetic-flux direction of the radio frequency coil unit 8.

FIGS. 4A, 4B, 4C are diagrams illustrating a structure of the slit 812a in FIG. 3B.

The slit 812a is formed along a circumferential direction of the coil case 81. The slit 812a guides the support portion 822 moving along the circumferential direction of the coil case 81. This structure enables the coil case 81 to rotate with respect to the coil case 82, as shown in FIGS. 4A, 4B and 4C. FIG. 4A illustrates a state where the coil case 81 is rotated counterclockwise to the utmost position. FIG. 4B illustrates a state where the coil case 81 is positioned in the center of its rotation range. FIG. 4C illustrates a state where the coil case 81 is rotated clockwise at the utmost position. The length of the slit 812a is set such that the rotatable angle of the coil case 81 is limited to be less than 180°, as shown in FIGS. 4A, 4B and 4C.

FIGS. 5A and 5B illustrate a coil accommodating state of the coil cases 81 and 82 shown in FIG. 2.

The radio frequency coil unit 8 further comprises a saddle coil 84 and a circular coil 85 that are accommodated in the coil case 81 and the coil case 82, respectively.

The saddle coil 84 is accommodated in the hollow portions 811a and 811b, as shown in FIG. 5A. The circular coil 85 is accommodated in the hollow portion 821a, as shown in FIG. 5B.

FIG. 6 is a diagram illustrating an example of a state where the radio frequency coil unit 8 is used.

In FIG. 6, the radio frequency coil unit 8 is placed on the top board 41. In placement, the position of the base 831 and the attitude of the holding portion 833 are adjusted such that the coil case 81 and the coil case 82 are close to the patient P. Therefore, inclination of the support portion 822 is varied with respect to the flux direction of the static magnetic field.

The saddle coil 84 has a direction dependency on the flux direction of the static magnetic field. Specifically, the magnetic flux generated by the saddle coil 84 has a direction corresponding to the side-to-side direction in FIG. 5A, and the direction is preferably set perpendicular to the flux direction of the static magnetic field as much as possible. Therefore, after the radio frequency coil unit 8 is set as described above, the user rotates the coil case 81 such that the direction of the magnetic flux generated by the saddle coil 84 is perpendicular to the flux direction of the static magnetic field. In MRI apparatuses where the flux of the static magnetic field has a horizontal direction, the user should set the mark M3 in the vertical direction. As another method, the user should align the straight-line portion of the coil case 81 with the flux direction of the static magnetic field.

The circular coil 85 does not have a direction dependency on the flux direction of the static magnetic field. Therefore, by adjusting the orientation of the saddle coil 84, a QD coil having a high S/N ratio is achieved by the saddle coil 84 and the circular coil 85. Specifically, the radio frequency coil unit 8 according to the first embodiment can be used as a general-purpose surface coil having merits of a QD coil.

Further, in the radio frequency coil unit 8 according to the first embodiment, the rotation range of the coil case 81 is limited to be less than 180°. If the coil case 81 is rotated by 180° or more, the relative phase relationship between a reception signal of the saddle coil 84 and a reception signal of the circular coil 85 is inverted, and they do not function as a QD coil. According to the first embodiment, it is possible to prevent this phenomenon, and maintain the QD state.

Further, since the marks M1 and M2 are provided on the radio frequency coil unit 8 of the first embodiment, the user can easily distinguish between the obverse side and the reverse side. This prevents misuse of the coil unit in an inverted state. If the radio frequency coil unit 8 of the first embodiment is used in the inverted state, the relative phase relationship between a reception signal of the saddle coil 84 and a reception signal of the circular coil 85 is inverted, and they do not function as a QD coil.

Second Embodiment

Figure 7:
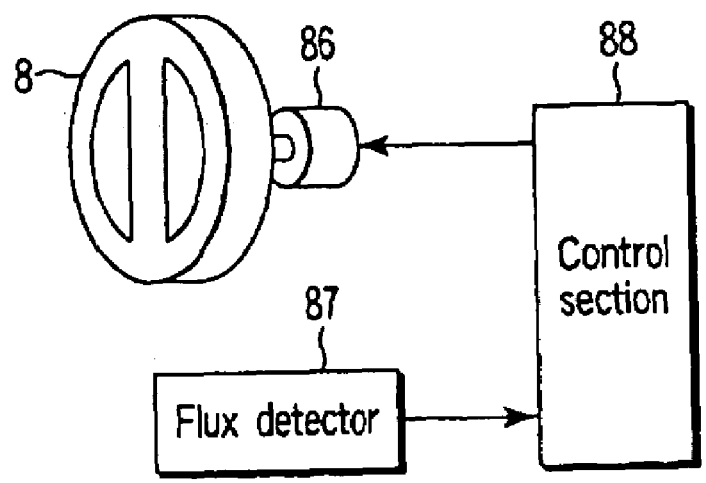
FIG. 7 illustrates a structure of the radio frequency coil unit shown in FIG. 1 in a second embodiment.

In the MRI apparatus according to a second embodiment, the radio frequency coil unit 8 has a structure as shown in FIG. 7. In FIG. 7, the same constituent elements as those in FIG. 2 are denoted by the same respective reference numerals. Further, in FIG. 7, some of the elements shown in FIG. 2 are not illustrated.

The radio frequency coil unit 8 according to the second embodiment comprises all the constituent elements of the radio frequency coil unit 8 according to the first embodiment, and further comprises a motor 86, a flux detector 87 and a control section 88.

The motor 86 rotates the coil case 81. The flux detector 87 senses a magnetic flux of the static magnetic field, and determines the direction of the magnetic flux. The control section 88 drives the motor 86 such that a straight-line portion of the coil case 81 is aligned with the flux direction determined by the flux detector 87.

By virtue of the above structure, according to the radio frequency coil unit 8 of the second embodiment, the orientation of the coil case 81 is automatically adjusted such that a direction of magnetic flux generated by a saddle coil 84 is perpendicular to the flux direction of the static magnetic field. This structure reduces the user's labor.

Third Embodiment

Figure 8:
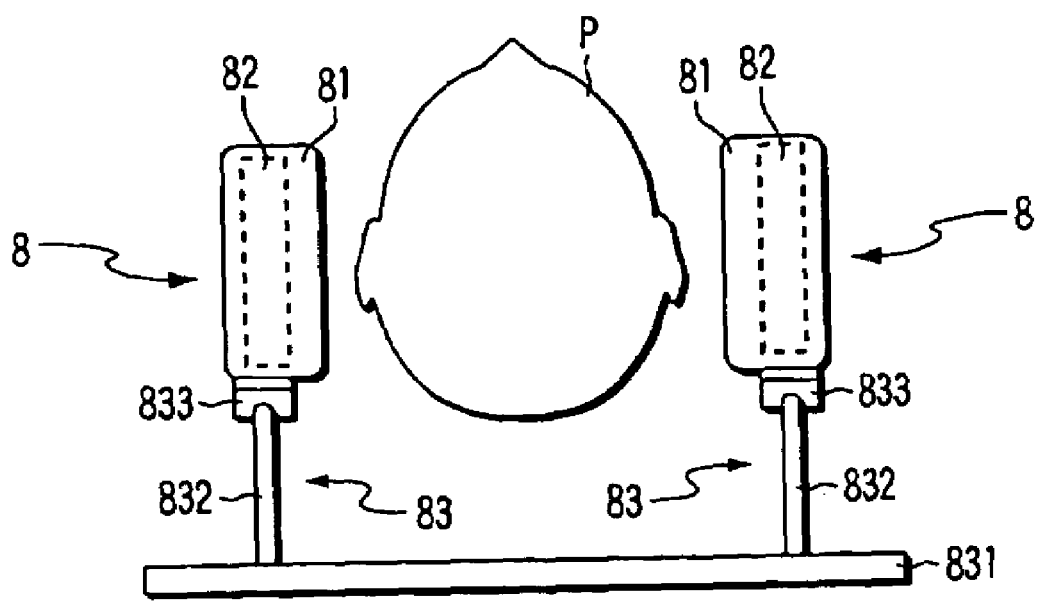
FIG. 8 illustrates a structure of the radio frequency coil unit shown in FIG. 1 in a third embodiment.

In the MRI apparatus according to a third embodiment, the high-frequency unit 8 has a structure as shown in FIG. 8. In FIG. 8, the same constituent elements as those in FIG. 2 are denoted by the same respective reference numerals. Further, in FIG. 8, some of the elements shown in FIG. 2 are not illustrated.

The radio frequency coil unit 8 according to the third embodiment comprises two coil sets. Each coil set comprises a coil case 81, a coil case 82, a holding member 83, a saddle coil 84 (not shown), and a circular coil 85 (not shown). Two bases for the two coil sets are formed as one base 831, and two arms 832 are attached to the base 831. The two arms 832 are positioned such that two sets of coil cases 81 and 82 are opposed to each other with a patient P interposed therebetween.

According to the radio frequency coil unit 8 of the third embodiment, two QD coils receive a magnetic resonance signal transmitted from the other set on the opposite side, and thereby an image with high quality is reconstructed.

The above embodiments can be variously modified as follows in carrying them out.

The coil case 81 and the coil case 82 may be rotated in synchronization with each other.

A coil of a type different from the saddle coil 84 may be used as a coil having a direction dependency.

Another type of coil having no direction dependency may be used instead of the circular coil 85. Further, a coil having a direction dependency may be provided instead of the circular coil 85.

The number of coils having a direction dependency may be only one, or may be three or more.

Any structure may be used to rotatably support the coil case 81. For example, a rotation axis may be used.

The means for automatically rotating the coil case 81 may be various modified. For example, an eccentric weight may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A surface radio frequency coil unit used in a magnetic resonance imaging (MRI) apparatus imaging a subject on the basis of a magnetic resonance signal radiated from the subject in a static magnetic field, said coil unit comprising:
   a radio frequency coil which receives the magnetic resonance signal and has a direction dependency on a flux direction of the static magnetic field; and
   a support member which enables the radio frequency coil to rotate with respect to the relationship between the flux of the static magnetic field and a magnetic-flux direction generated by the radio frequency coil, the magnetic-flux direction of the radio frequency coil being indicated by a mark.

2. A radio frequency coil unit according to claim 1, wherein the radio frequency coil is a quadrature coil.

3. A radio frequency coil unit according to claim 1, wherein a central axis of the radio frequency coil coincides with a rotation axis of the radio frequency coil.

4. A radio frequency coil unit according to claim 1, further comprising:
   a structure which limits a rotation angle of the radio frequency coil to a predetermined angle less than 180°.

5. A radio frequency coil unit according to claim 1, wherein
   the radio frequency coil includes a first coil and a second coil, and
   the support member rotates the first and the second coils with respect to each other.

6. A radio frequency coil unit according to claim 1, further comprising:
   a mark which distinguishes an obverse and a reverse of the radio frequency coil with respect to a direction along a rotation axis of the radio frequency coil.

7. A radio frequency coil unit according to claim 1, further comprising:
   a structure which automatically rotates the radio frequency coil such that an attitude of the radio frequency coil with respect to the static magnetic field is kept constant.

8. A radio frequency coil unit according to claim 1, further comprising:
   a detector which detects the flux direction of the static magnetic field; and
   a unit which rotates the radio frequency coil such that an attitude of the radio frequency coil with respect to the static magnetic field is kept constant.

9. A radio frequency coil unit according to claim 1, further comprising:
   a second radio frequency coil which receives the magnetic resonance signal and does not have a direction dependency on the flux direction of the static magnetic field, wherein the second radio frequency coil is accommodated in the support member.

10. A radio frequency coil unit according to claim 1, further comprising:
    a holding member which holds the support member such that an attitude of the support member is changeable in three-dimensional directions.

11. A radio frequency coil unit according to claim 1, further comprising:
    a holding member which has a flexible arm and holds the support member.

12. A radio frequency coil unit according to claim 1, further comprising:
    a holding member from which the support member is detachable.

13. A radio frequency coil unit according to claim 1, further comprising another radio frequency coil and another support member which jointly form a coil set,
    wherein the coil set of said another radio frequency coil and said another support member is opposed to a coil set including the radio frequency coil and the support member.

14. A magnetic resonance imaging apparatus comprising:
    a static magnetic coil which applies a static magnetic field to a subject;
    an gradient coil which applies a static magnetic field to a subject;
    a surface radio frequency coil which receives the magnetic resonance signal and has a direction dependency on a flux direction of the static magnetic field;
    a support member which enables the radio frequency coil to rotate with respect to the relationship between the flux direction of the static magnetic field and a magnetic-flux direction generated by the radio frequency coil, the magnetic-flux direction of the radio frequency coil being indicated by a mark; and
    a unit which reconstructs an image on the basis of the magnetic resonance signal received by the radio frequency coil.

15. A magnetic resonance imaging apparatus according to claim 14, wherein the radio frequency coil is a quadrature coil.

16. A magnetic resonance imaging apparatus according to claim 14, wherein a central axis of the radio frequency coil coincides with a rotation axis of the radio frequency coil.

17. A magnetic resonance imaging apparatus according to claim 14, further comprising:
    a structure which limits a rotation angle of the radio frequency coil to a predetermined angle less than 180°.

18. A magnetic resonance imaging apparatus according to claim 14, wherein
    the radio frequency coil includes a first coil and a second coil, and
    the support member rotates the first and the second coils in synchronization with each other.

19. A magnetic resonance imaging apparatus according to claim 14, further comprising:
a mark which distinguishes an obverse and a reverse of the radio frequency coil with respect to a direction along a rotation axis of the radio frequency coil.

20. A magnetic resonance imaging apparatus according to claim 14, further comprising:
a structure which automatically rotates the radio frequency coil such that an attitude of the radio frequency coil with respect to the static magnetic field is kept constant.

21. A magnetic resonance imaging apparatus according to claim 14, further comprising:
a detector which detects the flux direction of the static magnetic field; and
a unit which rotates the radio frequency coil such that an attitude of the radio frequency coil with respect to the static magnetic field is kept constant.

22. A magnetic resonance imaging apparatus according to claim 14, further comprising:
a second radio frequency coil which receives the magnetic resonance signal and does not have a direction dependency on the flux direction of the static magnetic field, wherein the second radio frequency coil is accommodated in the support member.

23. A magnetic resonance imaging apparatus according to claim 14, further comprising:
a holding member which holds the support member such that an attitude of the support member is changeable in three-dimensional directions.

24. A magnetic resonance imaging apparatus according to claim 14, further comprising:
a holding member which has a flexible arm and holds the support member.

25. A magnetic resonance imaging apparatus according to claim 14, further comprising:
a holding member from which the support member is detachable.

26. A magnetic resonance imaging apparatus according to claim 14, further comprising another radio frequency coil and another support member which jointly form a coil set, wherein the coil set of said another radio frequency coil and said another support member is opposed to a coil set including the radio frequency coil and the support member.

27. A general purpose MRI RF coil unit comprising:
a coil mount configured to permit three-dimensional movement inside an image volume of an MRI system;
a first RF coil disposed in a first housing;
a second RF coil disposed in a second housing;
at least one of said RF coils having a response that is dependent upon its rotational orientation with respect to a MRI system static magnetic field;
said first and second housings being rotationally coupled to one another for rotational movement with respect to each other; and
said first and second housing being mounted to said coil mount for movement together in three dimensions.

28. A general purpose MRI RF coil unit as in claim 27 wherein:
said housings are configured to limit said rotational movement to 180° or less; and
said coupled housings are marked to denote respective first and second sides thereof and the rotational position of said at least one coil.

29. A general purpose MRI RF coil unit as in claim 27 wherein said first coil comprises a QD coil with two back-to-back D-shaped halves and said second coil comprises a circularly-shaped coil.

30. A general purpose method for receiving MRI RF signals comprising:
providing a coil mount configured to permit three-dimensional movement inside an image volume of an MRI system;
disposing a first RF coil in a first housing and a second RF coil in a second housing, at least one of said RF coils having a response that is dependent upon its orientation with respect to an MRI system magnetic field;
moving said coupled first and second housings together in three dimensions using the provided coil mount; and
rotationally adjusting said first housing with respect to said second housing until said at least one RF coil is aligned with an MRI system static field.

31. A method as in claim 30 wherein:
said housings are configured to limit said rotational movement to 180° or less; and
said coupled housings are marked to denote respective first and second sides thereof and the rotational position of said at least one coil.

32. A method as in claim 30 wherein said first coil comprises a QD coil with two back-to-back D-shaped halves and said second coil comprises a circularly-shaped coil.

* * * * *